United States Patent [19]

Fujikura et al.

[11] Patent Number: 5,328,803
[45] Date of Patent: Jul. 12, 1994

[54] PHOTOPOLYMERIZABLE COMPOSITION

[75] Inventors: Sadao Fujikura; Masayuki Iwasaki; Yuichi Wakata, all of Shizuoka, Japan

[73] Assignee: Fuji Photo Film Co., Ltd., Kanagawa, Japan

[21] Appl. No.: 757,755

[22] Filed: Sep. 11, 1991

[30] Foreign Application Priority Data

Sep. 13, 1990 [JP] Japan .................................. 2-242977
Sep. 4, 1991 [JP] Japan .................................. 3-224379

[51] Int. Cl.$^5$ .............................................. G03C 1/68
[52] U.S. Cl. .................................... 430/281; 430/288; 430/910; 430/920; 430/926
[58] Field of Search ............... 430/281, 288, 920, 910, 430/926; 522/9, 14, 16, 26

[56] References Cited

U.S. PATENT DOCUMENTS

| | | | |
|---|---|---|---|
| 4,282,309 | 8/1981 | Laridon et al. | 430/281 |
| 4,543,318 | 9/1985 | Maeda et al. | 430/288 |
| 4,904,564 | 2/1990 | Chiong | 430/156 |
| 4,987,054 | 1/1991 | Sondergeld et al. | 430/275 |
| 5,030,548 | 7/1991 | Fujikuya et al. | 430/281 |
| 5,096,799 | 3/1992 | Fujikura et al. | 430/281 |

Primary Examiner—Marion E. McCamish
Assistant Examiner—Rosemary Ashton
Attorney, Agent, or Firm—Sughrue, Mion, Zinn, Macpeak & Seas

[57] ABSTRACT

A photopolymerizable composition developable with an alkali aqueous solution which comprises a carboxyl group-containing high polymer binder, a photopolymerizable monomer, a photopolymerization initiator system and a compound of a specific structure is disclosed. The photopolymerizable composition shows a good keeping stability in a state of lamination on a metal board and thus is highly useful in the production of, for example, dry films for print basic boards, photoresists, photomasks, lithograph boards and resin relief boards.

3 Claims, No Drawings

PHOTOPOLYMERIZABLE COMPOSITION

FIELD OF THE INVENTION

This invention relates to a photopolymerizable composition developable with an alkali aqueous solution which is usable to, for example, dry film photoresists for producing print boards, photomasks, lithograph boards or resin relief boards and which shows a high keeping stability in a state of lamination on a metal plate.

BACKGROUND OF THE INVENTION

In recent years, dry film resists have been widely used in many fields, for example, producing print boards.

It is well known to use a carboxyl group-containing high polymer binder as one of the materials for producing a dry film resist so as to enable the treatment of said dry film resist with an alkali aqueous solution.

When a resist comprising a carboxyl group-containing high polymer binder is laminated on a copper-clad laminate, however, frequently it is observed with the lapse of time that the surface of the unexposed portion of the copper plate turns reddish brown (so-called red-change) after completion of development or under-development (or the formation of scum) occurs. The troubles tend to become serious during processing. It is sometimes observed in practice that a resist laminated on a copper-clad laminate is allowed to stand as such for several days. Thus, both the red-change and under-development, which might frequently cause under-etching or peeling of plating film, are serious problems.

There have been proposals to add certain additives to a photopolymerization system to prevent the aforesaid red-change or under-development. For example, JP-B-58-22486 and JP-A-61-194438 propose to use low molecular weight carboxylic acids such as citric acid or malonic acid therefor (The terms "JP-B" and "JP-A" as used herein respectively mean an "examined Japanese patent publication" and an "unexamined published Japanese patent application"). While it is true that the addition of the carboxylic acids is effective in relieving the red-change or under-development, when the carboxylic acids are added in small amounts, sufficient effects cannot be achieved. On the other hand, when the acids are added in such a large amount as to attain satisfactory effects, the sensitivity is lowered or the alkali-resistance of the resulting resist is reduced. Thus none of the carboxylic acids is satisfactory as a red-change inhibitor.

SUMMARY OF THE INVENTION

It is an object of the present invention to provide a photopolymerizable composition developable with an alkali aqueous solution wherein the red-change, under-development and a decrease in sensitivity can be suppressed when stored in a state of lamination on a metal plate while achieving a high sensitivity and a good adhesiveness to the metal plate.

The present inventors have conducted extensive studies and thus found a photopolymerizable composition whereby the above-mentioned object can be achieved.

Accordingly, the object of the present invention has been achieved by a photopolymerizable composition developable with an alkali aqueous solution which is obtained by adding at least one compound selected from the group of compounds represented by the following general formulae (I), (II) and (III) to a composition comprising (1) a carboxyl group-containing high polymer binder; (2) a photopolymerizable monomer; and (3) a photopolymerization initiator system:

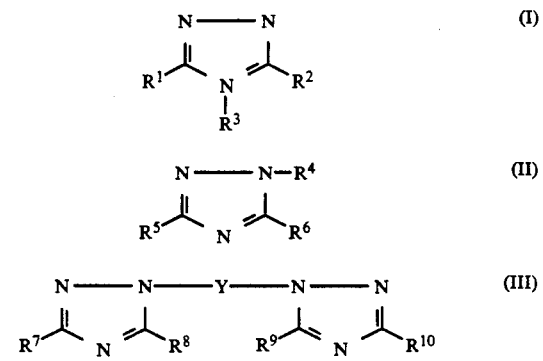

wherein $R^1$ to $R^{10}$ may be either the same or different and each represents H, $NR^{11}$ $OR^{11}$ $SR^{11}$, $COOR^{11}$, CN, a halogen atom, $NO_2$, CHO, $SO_3R^{11}$ $R^{11}CONHNH$ $R^{11}ISO_2NH$ an aryl group having 6 to 10 carbon atoms, an alkyl group having 1 to 10 (preferably 1 to 6) carbon atoms, an aminoalkyl group having 1 to 10 (preferably 1 to 6) carbon atoms, a hydroxyalkyl group having 1 to 10 (preferably 1 to 6) carbon atoms, a carboxyalkyl group having 1 to 10 (preferably 1 to 6) carbon atoms, an aralkyl group having 7 to 20 carbon atoms or a morpholino group; Y represents an alkylene group having 1 to 10 (preferably 1 to 6) carbon atoms, an arylene group having 6 to 12 carbon atoms or an aralkylene group having 7 to 25 carbon atoms which may be substituted by $NR^{11}$ $OR^{11}$ $SR^{11}$, $COOR^{11}$, CN a halogen atom, $NO_2$, CHO, $SO_3R^{11}$ $R^{11}CONHNH$, $R^{11}SO_2NH$, or a monophorino group, and which may contain between two carbon atoms a bivalent intervenient group of pyperadine residue, COO, $NR^{11}$, $SO_2$, $SO_2NR^{11}$ O, S, $CONR^{11}$, CONHCO or $COONR^{11}$; and $R^{11}$ represents H, an alkyl group having 1 to 10 (preferably 1 to 6) carbon atoms or an aryl group having 6 to 10 carbon atoms.

DETAILED DESCRIPTION OF THE INVENTION

Although the mechanism for the achievement of the effects has not been clarified in detail, it may proceed as follows. It is assumed, but by no means assured, that the effect of preventing red-change might relate to the fact that the compound having a specific structure represented by the general formula (I), (II) or (III) has a large mutual interaction with a plate and can be easily removed with an alkali developing solution.

The carboxyl group-containing high polymer binder used in the photopolymerizable composition of the present invention may be selected from among a number of synthetic, semi-synthetic and natural high polymer materials satisfying the requirements as specified below. Namely, the carboxyl group-containing high polymer binder should have good compatibility with a non-gaseous ethylenic unsaturated compound and a photopolymerization initiator system and thus never undergo liberation during the production process, from preparation of a coating solution to application and drying as well as during storage of the mixture. Further, it should have appropriate properties suitable for the usage of the present invention, namely, strength, stretching properties, abrasion resistance and chemical resistance of the binder when it is used as a photoresist for tinting. Furthermore, it should be appropriate in the content of the binder, intermolecular force, hardness, softening temperature, crystalline properties and elongation at break.

Examples of the binder include copolymers of (meth)acrylic acid with (meth)acrylates of alkyls (for example, methyl, ethyl and butyl), copolymers of poly(meth)acrylic acid, styrene and unsaturated dibasic acid anhydrides such as maleic anhydride, reaction products obtained by reacting the aforesaid polymers with alcohols and reaction products obtained by reacting cellulose with polybasic acid anhydrides.

Among the aforesaid polymers, those which are particularly suitable as a binder to be used in the present invention include styrene/maleic anhydride copolymer, methyl methacrylate/methacrylic acid/2-ethylhexyl methacrylate/benzyl methacrylate tetrapolymer described in JP-A-60-258539 (corresponding to U.S. Pat. No. 4,629,680), styrene/mono-n-butyl maleate copolymer described in JP-B-55-38961 (corresponding to U.S. Pat. No. 3,953,309), styrene/methyl methacrylate/ethyl acrylate/methacrylic acid tetrapolymer described in JP-B-54-25957, benzyl methacrylate/methacrylic acid copolymer described in JP-A-52-99810 (corresponding to U.S. Pat. No. 4,139,391), acrylonitrile/2-ethylhexyl methacrylate/methacrylic acid terpolymer described in JP-B-58-12577 (corresponding to U.S. Pat. No. 3,930,865) and methyl methacrylate/ethyl acrylate/acrylic acid terpolymer and styrene/maleic anhydride copolymer partially esterified with isopropanol described in JP-B-55-6210 (corresponding to U.S. Pat. No. 4,273,857).

Either one of the binders may be used alone. Alternately, a mixture obtained by mixing two or more polymers, which would never undergo liberation during the production process, from preparation of a coating solution to application and drying as well as during storage of the obtained mixture, at an appropriate ratio may be used as a binder.

The molecular weight of the high polymer material to be used as the binder may vary widely depending on the selected polymer(s). It generally may range from 5,000 to 2,000,000, preferably from 10,000 to 200,000 and still preferably from 40,000 to 85,000. When the molecular weight of the binder is less than 5,000, the resist obtained after photopolymerization has insufficient mechanical strength. On the other hand, a binder having a molecular weight exceeding 2,000,000 is unsuitable for achieving the object of the present invention, since the development properties are limited.

The content of the binder may preferably range from 40 to 90% by weight, still preferably from 50 to 70% by weight, based on the solid matters in the photopolymerizable composition. When the content of the binder is smaller than 40% by weight, the excessively high flowability of the photopolymerizable composition frequently induces creeping. When it exceeds 90% by weight, on the other hand, the difference in solubility between the exposed and unexposed parts becomes excessively small and thus excellent image properties cannot be achieved. Thus, both of the cases are unsuitable for achieving the object of the present invention.

Examples of the photopolymerizable monomers usable in the present invention include known (meth)acrylates described in JP-A-60-258539 and JP-A-2-269721.

More particularly, (meth)acrylates of polyols such as diethylene glycol di(meth)acrylate, triethylene glycol di(meth)acrylate, tetraethylene glycol di(meth)acrylate, nonaethylene glycol di(meth)acrylate, tetradecaethylene glycol di(meth)acrylate, nonapropylene glycol di(meth)acrylate, dodecapropylene glycol di(meth)acrylate, trimethylolpropane tri(meth)acrylate, trimethylolpropane ethylene oxide adduct tri(meth)acrylate, pentaerythritol di(meth)acrylate, pentaerythritol tri(meth)acrylate, pentaerythritol tetra(meth)acrylate, dipentaerythritol hexa(meth)acrylate, glycerol di(meth)acrylate and 1,3-propanediol di(meth)acrylate may be cited therefor.

As (meth)acrylamides, methylenebis(meth)acrylamide as well as poly(meth)acrylamides derived therefrom, for example, ethylenediamine, diaminopropane, diaminobutane, pentamethylenediamine, bis(2-aminopropyl)amine, diethylenetriaminediamine, phenylenediamine and diaminobenzoic acid may be cited.

As an allyl compound, diallyl esters of, for example, phthalic acid or malonic acid and diallyl esters of, for example, benzenedisulfonic acid and 2,5-dihydroxydisulfonic acid may be cited.

As examples of the vinyl ether compound, ethylene glycol divinyl ether, 1,3,5-tri-$\beta$-vinyloxyethoxybenzene may be cited.

As examples of the vinyl ester, divinyl succinate and divinyl adipate may be cited.

As examples of the styrene compound, divinylbenzene and p-allylstyrene may be cited.

Furthermore, a polyfunctional urethane compound having at least two ethylenic unsaturated groups, which is obtained by reacting a reaction product, obtained through a reaction between a polyol compound having at least two hydroxyl groups with a somewhat excessive amount of a polyisocyanate compound having at least two isocyanate groups, with a compound having at least one hydroxyl group and at least one ethylenic unsaturated group may be used in the present invention.

Of these, especially preferred are polyethylene glycol di(meth)acrylate, polypropylene glycol di(meth)acrylate and ethylenically unsaturated urethane compound.

The amount of the photopolymerizable monomer may range from 10 to 60% by weight, preferably from 25 to 50% by weight, based on the solid matter in the photopolymerizable composition. When the content is smaller than 10% by weight, the difference in solubility between the exposed and unexposed portions becomes excessively small and thus any excellent image properties cannot be achieved. When it exceeds 60% by weight, on the other hand, the excessively high flowability of the photopolymerizable composition frequently induces creeping, which is unsuitable for the object of the present invention.

A photopolymerization initiator to be used preferably in the present invention may contain at least one component having a molecular absorption coefficient of at least approximately 50 within a range of from approximately 300 to 800 nm, still preferably from 330 to 500 nm. For example, aromatic ketones, lophine dimers, benzoin and benzoin ethers, polyhalogens and combinations thereof may be cited therefor.

Particular examples thereof include the following compounds.

Namely, examples of the aromatic ketones include benzophenone, 4,4'-bis(dimethylamino)benzophenone, 4-methoxy-4'-dimethylaminobenzophenone, 4,4'-dimethoxybenzophenone, 4-dimethylaminobenzophenone, 4-dimethylaminoacetophenone, benzyl, anthraquinone, 2-tert-butylanthraquinone, 2-methylanthraquinone, xanthone, thioxanthone, 2-chlorothioxanthone, 2,4-diethylthioxanthone, fluorenone and acridone.

Suitable examples of the lophine dimer include those described in JP-B-45-37377, JP-B-48-38403 (corresponding to U.S. Pat. No. 3,549,367), JP-A-56-35134 (corresponding to U.S. Pat. Nos. 4,311,783 and 4,252,887) and JP-A-2-48664. For example, 2-(o-chlorophenyl)-4,5-diphenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer may be cited therefor.

As examples of benzoin and benzoin ethers, benzoin methyl ether, benzoin ethyl ether, benzoin isopropyl ether an benzoin phenyl ether may be cited.

As examples of the polyhalogen compounds, carbon tetrabromide, phenyltribromomethylphenylsulfone, phenyl trichloromethyl ketone and compounds described in JP-A-53-133428 (corresponding to U.S. Pat. No. 4,189,323), JP-B-57-1819 (corresponding to U.S. Pat. No. 3,987,037), JP-B-57-6096 (corresponding to U.S. Pat. Nos. 4,212,970 and 4,232,106) and U.S. Pat. No. 3,615,455 may be cited.

It is particularly preferable to use a combination of 4,4'-bis(dimethylamino)benzophenone, 4,4'-bis(diethylamino)benzophenone, 2,4-diethylthioxanthone or 4,4'-bis(diethylamino)-benzophenone with benzophenone or a combination of 4,4'-bis(diethylamino)benzophenone with phenyl tribromomethylphenyl-sulfone.

The content of the photopolymerization initiator system may preferably range from 0.1 to 20% by weight, still preferably from 0.2 to 10% by weight, based on the solid matter in the photopolymerizable composition. When the content is smaller than 0.1% by weight, only a poor sensitivity is obtained. When it exceeds 20% by weight, on the other hand, the film properties of the photopolymerizable composition are affected undesirably, which is unsuitable for the object of the present invention.

The 1,2,4-triazoles of the formula (I) and (II) to be employed in the present invention involves 1,2,4-triazole wherein all of the substituents are hydrogen atoms, alkyl/aryl-substituted triazoles, halogen triazoles, aminotriazoles, triazole carboxylic acids, 1,2,4-triazolones which are tautomers of hydroxytriazole and mercaptotriazoles.

Examples of alkyl/aryl-substituted triazoles include 1-methyl-1,2,4-triazole, 3-methyl-1,2,4-triazole, 3,5-dimethyl-1,2,4-triazole, 3,5-diethyl-1,2,4-triazole, 1-phenyl-1,2,4-triazole, 3-phenyl-1,2,4-triazole, 1,5-diphenyl-1,2,4-triazole, 1,3-diphenyl-1,2,4-triazole, 3,5-diphenyl-1,2,4-triazole and 1,3,5-triphenyl-1,2,4-triazole.

Examples of halogen triazoles include 3-chloro-1,2,4-triazole, 3-bromo-1,2,4-triazole, 3-iodo-1,2,4-triazole, 3-chloro-1-phenyl-1,2,4-triazole, 3-chloro-4-methyl-1,2,4-triazole and 5-chloro-3-methyl-4-phenyl-1,2,4-triazole.

Examples of aminotriazoles include 1-amino-1,2,4-triazole, 5-amino-3-methyl-1,2,4-triazole, 4-amino-1,2,4-triazole, 4-amino-3,5-dimethyl-1,2,4-triazole, 3-(β-aminoethyl)-1,2,4-triazole and 3,5-diamino-1,2,4-triazole.

Examples of mercaptotriazoles include 3-mercapto-1,2,4-triazole, 4-methyl-3-mercapto-1,2,4-triazole, 5-mercapto-1-phenyl-1,2,4-triazole, 4-amino-3-mercapto-1,2,4-triazole, 3-mercapto-1,5-diphenyl-1,2,4-triazole and 5-(p-aminophenyl)-3-mercapto-1,2,4-triazole.

Examples of triazole carboxylic acids include 1,2,4-triazole-3(5)-carboxylic acid, 1-phenyl-1,2,4-triazole-3-carboxylic acid, 1,2,4-triazol-1-yl-acetic acid, 1-phenyl-1,2,4-triazole-3,5-dicarboxylic acid, ethyl 1-(p-aminophenyl)-5-oxy-1,2,4-triazole-3-carboxylate, 5-amino-1,2,4-triazole-3-carboxylic acid and 4-amino-1,2,4-triazole-3,5-dicarboxylic acid.

Examples of 1,2,4-triazolones which are tautomers of hydroxytriazole include 1,2,4-triazolone, 1,2,4-triazol-3-one, 5-methyl-1,2,4-triazol-3-one, 1-phenyl-1,2,4-triazol-3-one and 1-phenyl-1,2,4-triazol-5-one-3-carboxylic acid.

As well as the 1,2,4-triazole compounds represented by the general formula (I) or (II), a condensation product of 1,2,4-triazoles, represented by the general formula (III) may be employed in the present invention.

Examples of 1,2,4-triazoles-condensation product include 1,2,4-triazole-formaldehyde, 1,2,4-triazole-formaldehyde-pyperadine, 1,2,4-triazole-α,ω-diburomoalkane, 1,2,4-triazole-bisphenol A, etc.

Among the compounds noted above, aminotriazoles, triazole carboxylic acids, triazolones and 1,2,4-triazole-formaldehyde-pyperadine-condensation product are particularly preferable.

Either one of the compounds or a mixture thereof may be used in the present invention.

The total content of the compound(s) represented by the formula (I), (II) or (III) may range from 0.1 to 10% by weight, preferably from 0.2 to 5% by weight, based on the solid matter in the photopolymerizable composition. When the content is smaller than 0.1% by weight, only a poor effect of preventing red-change can be achieved. When it exceeds 10% by weight, on the other hand, the resist properties are reduced and thus the photopolymerizable composition cannot withstand etching or plating, which is unsuitable for the object of the present invention.

As described above, the photopolymerizable composition of the present invention comprises a carboxyl group-containing high polymer binder, a photopolymerization initiator system, at least one compound selected from the group of compounds represented by the general formulae (I), (II) and (III) and a photopolymerizable monomer. In addition to the essential components, the photopolymerizable composition of the present invention further may contain additives such as a thermal polymerization inhibitor, a plasticizer, a pigment, a color changing agent or an adhesion accelerator so as to give the desired photoresist, resin relief board, lithograph board or photomask.

The thermal polymerization inhibitor is added to prevent the thermal polymerization or polymerization with the lapse of time of the photopolymerizable composition. Thus the chemical stability of the photopolymerizable composition during the preparation process or over the storage period prior to lamination onto a metal board may be elevated. Examples of the thermal polymerization inhibitor include p-methoxyphenol, hydroquinone, benzoquinone, o-toluquinone, p-toluquinone, t-butyl catechol, pyrogallol, 2-hydroxybenzophenone, 4-methoxy 2- hydroxybenzophenone, cuprous chloride, phenothiazine, fluoranil, chloranil, napthylamine, pyridine, p-toluidine, β-naphthol, 2,6-di-t-butyl-p-cresol, nitrobenzene, dinitrobenzene, picric acid, aluminum salt or ammonium salt of N-nitrosophenylhydroxylamine, methylene blue organic copper, methyl salicylate and aryl phosphite.

The thermal polymerization inhibitor may be preferably added in an amount of from 0.001 to 10% by weight, still preferably from 0.01 to 3% by weight, based on the solid matter in the photopolymerizable composition. When the content is smaller than 0.001% by weight, the obtained photopolymerizable composition shows a poor thermal stability. When it exceeds 10% by weight, on the other hand, the sensitivity is reduced.

The plasticizer is added in order to control the film properties, other physicochemical properties and the light-sensitivity of the photopolymerizable composition before or after the light-setting. Examples thereof include phthalates such as dibutyl phthalates, diheptyl phthalate, dioctyl phthalate and diallyl phthalate, glycol esters such as triethylene glycol diacetate and tetraethylene glycol diacetate, acid amides such as p-toluenesulfonamide, benzenesulfonamide and N-n-butylbenzenesulfonamide, aliphatic dibasic acid esters such as diisobutyl adipate, dioctyl azelate and dibutyl maleate, tributyl citrate, glycerol triacetate, butyl laurate and dioctyl 4,5-diepoxycyclohexane-1,2-dicarboxylate.

The plasticizer may be added preferably in an amount of from 0.001% by weight to 50% by weight, still preferably from 0.01 to 20% by weight, based on the solid matter in the photopolymerizable composition. When its content exceeds 50% by weight, the development properties and the qualities of an image are affected undesirably.

The pigment is added to color the photopolymerizable composition. Examples thereof include malachite green, methyl green, brilliant green, methyl violet, crystal violet, ethyl violet, Victoria pure blue BOH, oil blue #603 (product of Orient Chemical Industries, K.K.), eosin, erythrocin B, rose bengal, Rhodamine B, Rhodamine 6G, 2,7-dichlorofluorescein, phenolphthaleine, Alizarin Red S, thymolphthalein, quinaldine red, methanil yellow, thymolsulfophthaleine, diphenyltriazene, xylenol blue, methyl Congo Red, diphenylthiocarbazone, p-methyl red, Congo Red, Benzopurpurin 4B, α-naphthyl red, Nile blue A, phenacetalin, p-fuchsin and basic fuchsin.

The pigment may be added preferably in an amount of from 0.001 to 10% by weight, still preferably from 0.1 to 5% by weight, based on the solid matter in the photopolymerizable composition. When its content exceeds 10% by weight, the sensitivity of the composition is affected undesirably.

The color changing agent is added to give a visible image when the photopolymerizable composition is irradiated with light via a photomask. Examples thereof include the materials cited above as examples of the pigment as well as diphenylamine, dibenzylaniline, triphenylamine, diethylaniline, diphenyl-p-phenylenediamine, p-toluidine, 4,4'-biphenyldiamine, o-chloroaniline, p,p',p''-hexamethyltriaminotriphenylmethane, p,p'-tetramethyldiaminotriphenylmethane and p,p',p''-triaminotriphenylcarbinol.

The color changing agent may be added preferably in an amount of from 0.001 to 10% by weight, still preferably from 0.01 to 5% by weight, based on the solid matter in the photopolymerizable composition. When its content exceeds 10% by weight, a decrease in sensitivity and/or fogging are observed frequently.

The adhesion accelerator is added to enhance the adhesiveness of the photopolymerizable composition to the surface of a metal board made of, for example, copper, stainless, anodized aluminum or silicon.

Examples of adhesion accelerators include benzimidazole, benzthiazole and benztriazole described in JP-B-50-9177, 2-mercaptobenzthiazole and 2-mercaptobenzimidazole described in JP-A-53-702 and compounds described in JP-A-59-113432, JP-A-59-16501, JP-A-60-12543, JP-A-60-12544 and JP-A-61-172139.

The adhesion accelerator may be added preferably in an amount of from 0.001 to 10% by weight, still preferably from 0.01 to 5% by weight, based on the solid matter in the photopolymerizable composition. When the content exceeds 10% by weight, under-development is induced frequently.

The photopolymerizable composition of the present invention can form a resist image by laminating on a basic board, exposing to light and removing the unexposed part by dissolution (development). The photopolymerizable composition of the present invention can be developed with an alkali aqueous solution. Examples of the developing solution include 0.1 to 10% by weight aqueous solutions of sodium hydroxide, potassium hydroxide, lithium hydroxide, sodium carbonate, potassium carbonate, lithium carbonate or ammonia. It is also possible in some cases to use amines, for example, primary amines such as butylamine, hexylamine, benzylamine and allylamine, secondary amines such as diethylamine and benzylethylamine, tertiary amines such as triethylamine, hydroxylamines such as ethanolemine, diethanolamine, triethanolamine and 2-amino-1,3-propanediol and cyclic amines such as morpholine, pyridine, piperazine and piperidine, basic salts such as sulfates, carbonates and bicarbonates of the amines, alkali metal phosphates and pyrophosphates and hydroxy salts such as tetramethylammonium hydroxide and choline.

To further illustrate the present invention, and not by way of limitation, the following Examples will be given wherein all parts are by weight unless otherwise noted.

EXAMPLES 1 TO 20 AND COMPARATIVE EXAMPLES 1 TO 4

The materials as given below were mixed to thereby give a homogeneous solution.

| | |
|---|---|
| methyl methacrylate/methacrylic acid/2-ethylhexyl acrylate/benzyl methacrylate tetrapolymer (molar ratio = 55/28/12/5, weight-average molecular weight = 79,000, in the form of 35% by weight solution in methyl ethyl ketone/1-methoxy-2-propanol = 2/1) | 45 parts |
| dodecapropylene glycol diacrylate | 6.5 |
| tetraethylene glycol dimethacrylate | 1.5 |
| p-toluenesulfonamide | 0.5 |
| 4,4'-bis(diethylamino)benzophenone | 0.05 |
| benzophenone | 1.0 |
| 2-(2'-chlorophenyl)-4,5-diphenylimidazole dimer (25% by weight solution in dichloromethane) | 2.0 |
| tribromomethylphenylsulfone | 0.1 |
| leucocrystal violet | 0.1 |
| malachite green | 0.01 |

To the solution thus obtained, each compound to be used in the present invention as listed in Table 1 (Examples 1 to 20) and citric acid or another compound described in JP-A-61-194438 (Comparative Examples 2 to 4) were added each in an amount as specified in Table 1.

After dissolving by stirring, each solution was applied onto a tentative polyethylene terephthalate sheet of a thickness of 20 μm. After drying at 100° C. for 2 minutes, a photosensitive material having a photosensitive resin composition coating layer of a thickness of approximately 40 μm was obtained. Two sheets of the photosensitive material were laminated onto a cleaned copper-clad laminate (copper thickness=35 μm) at 105° C. One of the sheets was screened and allowed to stand at 23° C. at a relative humidity of 65% for 4 days. After 15 minutes, the other sheet was exposed to light of various quantities with the use of a 5 kW ultra-high pressure mercury lamp HMW-532D (product of Oak K.K.) via two negative originals, the properties of which will be shown below.

Chart A: line width/space width (L/S)=⅓, line width=30 to 100 μm (10 μ step, 5 lines of each width were given.)

Chart B: Fuji Step Guide P (concentration step=0.15).

After completing the exposure, the sheet was developed by spraying a 1% aqueous solution of sodium carbonate (30° C.) for 40 seconds and then washing with water at 20° C. for 40 seconds. The resist patterns of the originals A and B thus obtained were observed with the naked eye and examined under an optical microscope. The evaluation was performed as follows.

Sensitivity

The clear step number of the pattern of the Chart B obtained by exposing to light of 100 mj/cm$^2$ was referred to as the sensitivity. In the method, a larger step number means higher sensitivity.

Adhesiveness

The pattern of Chart A obtained by exposing to light of such a quantity as to give 8 step clear was observed. The thinnest line width in which none of the five lines suffered from any twisting or peeling was referred to as the adhesiveness. In the method, a thinner line width means higher adhesiveness.

Evaluation of Performance after Lamination

The sample, which had been screened and allowed to stand at 23° C. at a relative humidity of 65% following the lamination, was treated in the same manner as described above. Then the sample was evaluated by the following methods.

Sensitivity

The same method as described above was employed.

Red-change

The color of the non-image portion of the pattern obtained by exposing and developing with the use of Chart A was observed with the naked eye. A sample which showed less reddish brown color is preferred.

Observation of Granular Solids

The color of the non-image portion of the pattern obtained by exposing and developing with the use of Chart A was observed under a microscope and the presence of granular solids was examined.

Etching Properties

After testing the red-change and granular solids, the same sample was etched. A sample in which no copper remained in the non-image portion was regarded as good.

The etching was performed with the use of a etching solution comprising 400 g/l of copper chloride dihydrate and 100 g/l of 35% hydrochloric acid at a solution temperature of 45° C. under a spray pressure of 2.0 kg/cm$^2$ for an etching time of 2.0 minutes and a washing time of 2.0 minutes.

Table 1 summarizes the results of the evaluation.

TABLE 1

| | Compound | | | Amount | Sensitivity After lami. | | Adhesiveness | Red | Etching |
| | $R^1$ | $R^2$ | $R^3$ | (part) | 15 min. (step) | 4 day (step) | (μm) | change | properties |
| --- | --- | --- | --- | --- | --- | --- | --- | --- | --- |
| Ex. 1 | H | H | H | 0.05 | 9 | 9 | 40 | no | good |
| Ex. 2 | H | $NH_2$ | $NH_2$ | 0.05 | 9 | 9 | 40 | no | good |
| Ex. 3 | $NH_2$ | $NH_2$ | H | 0.05 | 9 | 9 | 40 | no | good |
| Ex. 4 | $NH_2$ | $NH_2$ | $NH_2$ | 0.05 | 9 | 9 | 40 | no | good |
| Ex. 5 | H | H | $NH_2$ | 0.05 | 9 | 9 | 40 | no | good |
| Ex. 6 | H | SH | Ph | 0.05 | 9 | 9 | 40 | no | good |
| Ex. 7 | H | H | $CH_2CH_2COOH$ | 0.05 | 9 | 9 | 40 | no | good |
| Ex. 8 | H | COOH | H | 0.05 | 9 | 9 | 40 | no | good |
| Ex. 9 | OH | OH | H | 0.05 | 9 | 9 | 40 | no | good |
| Ex. 10 | Cl | H | H | 0.05 | 9 | 9 | 40 | no | good |
| Ex. 11 | 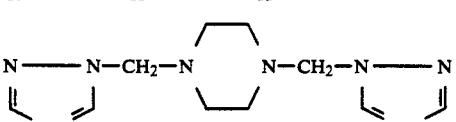 | | | 0.05 | 9 | 9 | 40 | no | good |
| Ex. 12 | 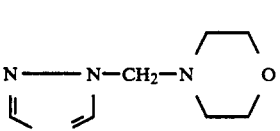 | | | 0.05 | 9 | 9 | 40 | no | good |
| Ex. 13 | 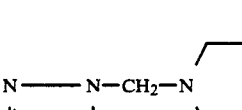 | | | 0.05 | 9 | 9 | 40 | no | good |

TABLE 1-continued

| | Compound | | | Amount (part) | Sensitivity After lami. 15 min. (step) | 4 day (step) | Adhesiveness (μm) | Red change | Etching properties |
|---|---|---|---|---|---|---|---|---|---|
| | $R^1$ | $R^2$ | $R^3$ | | | | | | |
| Ex. 14 | | N——N—CH$_2$—N(piperidine) with fused triazole on R$^1$ | | 0.05 | 9 | 9 | 40 | no | good |
| Ex. 15 | | N——N—(CH$_2$)$_5$—CH$_3$ (triazole) | | 0.05 | 9 | 9 | 40 | no | good |
| Ex. 16 | | N——N—(CH$_2$)$_8$—CH$_3$ (triazole) | | 0.05 | 9 | 9 | 40 | no | good |
| Ex. 17 | | N——N—(CH$_2$)$_5$—N——N (bis-triazole) | | 0.05 | 9 | 9 | 40 | no | good |
| Ex. 18 | | N——N—CH$_2$—C$_6$H$_4$—CH$_3$ (triazole) | | 0.05 | 9 | 9 | 40 | no | good |
| Ex. 19 | | N——N—CH$_2$—C$_6$H$_4$—CH$_2$—N——N (bis-triazole) | | 0.05 | 9 | 9 | 40 | no | good |
| Ex. 20 | | N——N—CH$_2$—C$_6$H$_4$ (with vinyl) (triazole) | | 0.05 | 9 | 9 | 40 | no | good |
| C. Ex. 1 | none | | | — | 9 | 9 | 40 | yes | Cu residue |
| C. Ex. 2 | citric acid | | | 0.05 | 9 | 8 | 60 | yes | Cu residue |
| C. Ex. 3 | citric acid | | | 0.5 | 8 | 6 | 80 | no | good |
| C. Ex. 4 | malonic acid | | | 0.5 | 8 | 8 | 60 | yes | Cu residue |

As Table 1 shows, the photopolymerizable composition of the present invention (1) never suffered from any substantial red-change; (2) never showed any substantial decrease in sensitivity; and (3) had good etching properties; after laminating on a copper-clad laminate followed by storing. In addition, it (4) showed a high sensitivity; and (5) a good adhesiveness to the resist pattern when evaluated immediately after lamination onto the copper-clad laminate. The facts clearly indicate that the photopolymerizable composition of the present invention is superior to known compositions.

While the invention has been described in detail and with reference to specific examples thereof, it will be apparent to one skilled in the art that various changes and modifications can be made therein without departing from the spirit and scope thereof.

What is claimed is:

1. A photopolymerizable composition developable with an alkali aqueous solution which comprises:

(1) a carboxyl group-containing high polymer binder having the weight-average molecular weight of 5,000 to 2,000,000 in the amount of 40 to 90% by weight;

(2) a photopolymerizable monomer in the amount of 10 to 60% by weight;

(3) a photopolymerization initiator system comprising a lophine dimer in the amount of 0.1 to 20% by weight; and (4) at least one compound selected from the group consisting of compound represented by the general formulae (I), (II) and (III) in the amount of 0.1 to 10% by weight:

wherein $R^1$ to $R^{10}$ may be either the same or different and each represents H, $NR^{11}{}_2$, $OR^{11}$, $SR^{11}$, $COOR^{11}$, CN a halogen atom, $NO_2$, CHO, $SO_3R^{11}$, $R^{11}CONHNH$, $R^{11}SO_2NH$, an aryl group having 6 to 10 carbon atoms, an alkyl group having 1 to 10 carbon atoms, an aminoalkyl group having 1 to 10 carbon atoms, a hydroxyalkyl group having 1 to 10 carbon atoms, a carboxyalkyl group having 1 to 10 carbon atoms, an aralkyl group having 7 to 20 carbon atoms or a monophorino group; Y represents an alkylene group having 1 to 10 carbon atoms, an arylene group having 6 to 12 carbon atoms or an aralkylene group having 7 to 25 carbon atoms which may be substituted by $NR^{11}_2$, $OR^{11}$, $SR^{11}$, $COOR^{11}$, CN, a halogen atom, $NO_2$, CHO, $SO_3R^{11}$, $R^{11}CONHNH$, $R^{11}SO_2NH$, or a monophorino group, and which may contain between two carbon atoms a bivalent intervenient group of pyperadine residue, COO, $NR^{11}$, $SO_2$, $SO_2NR^{11}$, O, S, $CONR^{11}$, CONHCO or $COONR^{11}$;

wherein $R^{11}$ represents H, an alkyl group having 1 to 10 carbon atoms or an aryl group having 6 to 10 carbon atoms.

2. A photopolymerizable composition as claimed in claim 1, wherein the weight-average molecular weight of said carboxyl group-containing high polymer binder is from 40,000 to 85,000.

3. A photopolymerizable composition as claimed in claim 2, wherein said carboxyl group-containing high polymer binder is a tetrapolymer of methacrylic acid, methyl methacrylate, benzyl methacrylate and 2-ethylhexyl acrylate.

* * * * *